(12) United States Patent
Uya

(10) Patent No.: US 7,759,707 B2
(45) Date of Patent: Jul. 20, 2010

(54) SEMICONDUCTOR SUBSTRATE, SEMICONDUCTOR DEVICE, METHOD OF PRODUCING SEMICONDUCTOR SUBSTRATE, AND METHOD OF PRODUCING SEMICONDUCTOR DEVICE

(75) Inventor: Shinji Uya, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 33 days.

(21) Appl. No.: 12/104,592

(22) Filed: Apr. 17, 2008

(65) Prior Publication Data

US 2009/0039396 A1 Feb. 12, 2009

(30) Foreign Application Priority Data

May 9, 2007 (JP) .............................. P2007-124677

(51) Int. Cl.
*H01L 27/148* (2006.01)
*H01L 29/768* (2006.01)

(52) U.S. Cl. ......................... 257/228; 257/797; 438/416

(58) Field of Classification Search .................. 257/228, 257/797, E27.122, E21.215; 438/401, 416, 438/418
See application file for complete search history.

(56) References Cited

U.S. PATENT DOCUMENTS 5,358,908 A * 10/1994 Reinberg et al. .............. 438/20

7,220,655 B1 * 5/2007 Hause et al. ................. 438/424
2005/0012228 A1 * 1/2005 Hiramatsu et al. .......... 257/797

FOREIGN PATENT DOCUMENTS

| JP | 2003-273343 A | 9/2003 |
| JP | 2005-150463 A | 6/2005 |
| JP | 2005-268738 A | 9/2005 |

\* cited by examiner

*Primary Examiner*—Phuc T Dang
(74) *Attorney, Agent, or Firm*—Birch, Stewart, Kolasch & Birch, LLP

(57) ABSTRACT

A semiconductor substrate includes: a first semiconductor layer; an oxide layer that is formed on the first semiconductor layer; a second semiconductor layer that is formed on the oxide layer; a first recess that is formed in the second semiconductor layer with extending from an upper face of the second semiconductor layer toward the first semiconductor layer, the first recess being formed at a position where an alignment mark for determining a forming position of an element which is to be built in the semiconductor substrate is to be formed; and an etching prevention layer that is inwardly formed from a position of an upper face of the first semiconductor layer, the position corresponding to the recess, the layer comprising a material that is prevented from being etched during etching of the first semiconductor layer.

17 Claims, 7 Drawing Sheets

SEMICONDUCTOR SUBSTRATE, SEMICONDUCTOR DEVICE, METHOD OF PRODUCING SEMICONDUCTOR SUBSTRATE, AND METHOD OF PRODUCING SEMICONDUCTOR DEVICE

BACKGROUND OF THE INVENTION

1. Field of the Invention

The present invention relates to a semiconductor substrate having: a first semiconductor layer; an oxide layer which is formed on the first semiconductor layer; and a second semiconductor layer which is formed on the oxide layer.

2. Background Art

A backside illumination image pickup device has been proposed in which an image is taken while the backside of a semiconductor substrate is irradiated with light, charges that are generated in the semiconductor substrate in accordance with the light are accumulated in a charge accumulation region formed in a surface side of the semiconductor substrate, and a signal corresponding to charges accumulated in the region is output to the outside by a CCD, a CMOS circuit, or the like that is formed in the surface side of the semiconductor substrate. Hereinafter, a usual pickup device which is currently widely used is referred to as a surface illumination image pickup device, in contrast to the backside illumination image pickup device.

In a backside illumination image pickup device, in order to enable a color image to be taken, a structure of a color filter, microlenses, or the like must be formed in the back face side of a semiconductor substrate in accordance with a structure formed in the surface side of the semiconductor substrate. Therefore, it is necessary to dispose an alignment mark for positionally aligning the structure formed in the surface side of the semiconductor substrate with that formed in the back face side.

JP-A-2003-273343 (the term "JP-A" as used herein means an "unexamined published Japanese patent application") discloses a system in which, a mark is formed by a device constituting layer on the surface side of a backside illumination image pickup device, and the mark is detected by red light or IR light from the back face side. In this method, however, there are disadvantages such as that the wavelength of the detection light is long and hence the alignment accuracy is lowered, and that, when a silicon layer for performing photoelectric conversion is sufficiently thick, visible light is not substantially transmitted through the silicon layer, and therefore the intensity of light reflected from the mark is significantly lowered and the detection becomes uncertain.

As an alignment mark which can be surely detected from both the front and back sides, JP-A-2005-150463 proposes an alignment mark which is configured by forming a trench penetrating through a silicon layer, and embedding an oxide film in the trench, and JP-A-2005-268738 proposes an alignment mark which is configured by forming a trench penetrating through a silicon layer, and embedding a material different in quality from silicon, in the trench.

In the alignment marks proposed in JP-A-2005-150463 and JP-A-2005-268738, however, there occur the following problems.

It has been experimentally known that, in a backside illumination image pickup device, a silicon substrate (photoelectric converting region) must have a thickness of about 10 μm in order to absorb most of visible light. For example, a usual automatic alignment mark is configured by squares of 4 μm which are arranged in 7× several rows at intervals of 4 μm. In the case where the silicon substrate has a thickness of 10 μm, in order to embed an oxide film or a material different from silicon in a trench of 4 μm square, a film of an embedding material must be formed at a thickness which is larger than 2 μm, and the material of the same film thickness must be removed from the substrate. Considerable loads are applied to these steps, and hence there arises problems such as that the production cost is increased.

In the case of a backside illumination image pickup device, the production steps include a heating step. When a high-temperature thermal process is executed on an alignment mark formed by proximately embedding a material which is different in thermal expansion coefficient from silicon, in a column-like shape, there is a danger that the mark structure is broken by thermal stress during the high-temperature thermal process. In the case where polysilicon or amorphous silicon is embedded in a trench, such thermal stress is reduced. In this case, however, the refractive index is equal to that of silicon, and hence it is difficult to detect the mark.

SUMMARY OF THE INVENTION

The invention has been conducted in view of the above-discussed circumstances. It is an object of the invention to provide a semiconductor substrate in which, during production of a semiconductor device in which a device structure is built in the front and back of the substrate, the front and back device structures can be accurately aligned with each other by a simple configuration.

(1) According to a first aspect of the present invention, a semiconductor substrate includes: a first semiconductor layer; an oxide layer that is formed on the first semiconductor layer; a second semiconductor layer that is formed on the oxide layer; a first recess that is formed in the second semiconductor layer with extending from an upper face of the second semiconductor layer toward the first semiconductor layer, the first recess being formed at a position where an alignment mark for determining a forming position of an element which is to be built in the semiconductor substrate is to be formed; and an etching prevention layer that is inwardly formed from a position of an upper face of the first semiconductor layer, the position corresponding to the recess, the layer comprising a material that is prevented from being etched during etching of the first semiconductor layer.

(2) The semiconductor substrate as described in the item (1), wherein the second semiconductor layer includes: a third semiconductor layer that is formed on the oxide layer; and a fourth semiconductor layer that is formed on the third semiconductor layer, a second recess is formed in the third semiconductor layer with extending from an upper face of the third semiconductor layer toward the first semiconductor layer, at a position corresponding to the etching prevention layer, and the first recess formed in the second semiconductor layer is formed in the fourth semiconductor layer, reflecting shapes of the second recess formed in the third semiconductor layer.

(3) The semiconductor substrate as described in the item (1) or (2), wherein the etching prevention layer includes an oxide.

(4) The semiconductor substrate as described in the item (1) or (2), wherein the etching prevention layer includes a semiconductor doped with boron.

(5) The semiconductor substrate as described in the item (4), wherein the boron has a concentration of $1 \times 10^{19}/cm^3$ or more.

(6) According to a second aspect of the invention, a semiconductor device includes: a semiconductor substrate according to any one of the items (1) to (5); a first device component group that is formed on a face opposite to an oxide layer side of the second semiconductor layer being in a region of the semiconductor substrate where the element is to be formed; and a second device component group that is formed on a face opposite to a second-semiconductor layer side of the oxide layer being in the region of the semiconductor substrate where the element is to be formed.

(7) The semiconductor device as claimed in the item (6), wherein the first device component group includes: a charge accumulating portion that accumulates charges generated in the second semiconductor layer in accordance with light from the oxide layer side; and a signal outputting portion that outputs a signal corresponding to the charges accumulated in the charge accumulating portion, and the second device component group includes at least one of an optical system for collecting light to the charge accumulating portion, and a spectral filter.

(8) According to a third aspect of the invention, A method of producing a semiconductor substrate, the semiconductor substrate including: a first semiconductor layer; an oxide layer that is formed on the first semiconductor layer; and a second semiconductor layer that is formed on the oxide layer, the method including: forming a predetermined mask pattern on the second semiconductor layer; implanting ions into a region that is inside from the upper face of the first semiconductor layer, through the predetermined mask pattern, the ions causing a material of the region to be changed; and forming a recess in the second semiconductor layer by etching through the predetermined mask pattern in the second semiconductor layer and oxide layer being below openings of the predetermined mask pattern to remove at least a part of the second semiconductor layer, and wherein the openings of the predetermined mask pattern are formed so that the recess is formed at a position where an alignment mark for determining a forming position of an element that is to be built in the semiconductor substrate is to be formed.

(9) The method as described in the item (8), further including: forming a third semiconductor layer that reflects shapes of the recess on the second semiconductor layer by performing epitaxial growth in which the second semiconductor layer is used as a substrate after the implanting of the ion and the forming of the recess.

(10) The method as described in the item (8) or (9), wherein the ions are oxygen, and the method includes heating a region into which the oxygen is implanted after the implanting of the ion.

(11) The method as described in the item (8) or (9), wherein the ions are boron.

(12) The method as described in the item (11), wherein the boron has a concentration of $1\times10^{19}/cm^3$ or more.

(13) According to a fourth aspect of the invention, a method of producing a semiconductor device in which a semiconductor substrate according to any one of the items (1) to (3) is used, the method including: forming a first device component group that includes components of the semiconductor device, on a face opposite to an oxide layer side of the second semiconductor layer, with using the first recess as a reference, in the second semiconductor layer and oxide layer being in a region which is defined by the first recess in the semiconductor substrate and the etching prevention layer, and in which the semiconductor device is to be formed; etching the first semiconductor layer to remove the first semiconductor layer other than the etching prevention layer after the forming of the first-device component group; and forming a second device component group that includes components of the semiconductor device, on a layer, with using the etching prevention layer as a reference after the removing of the first-semiconductor layer.

(14) According to a fifth aspect of the invention, a method of producing a semiconductor device in which a semiconductor substrate according to the item (4) or (5) is used, the method including: forming a first device component group that includes components of the semiconductor device, on a face opposite to an oxide layer side of the second semiconductor layer, with using the first recess as a reference, in the second semiconductor layer and oxide layer that are in a region which is defined by the first recess in the semiconductor substrate and the etching prevention layer, and in which the semiconductor device is to be formed; performing etching using potassium hydroxide as an etchant on the first semiconductor layer to remove the first semiconductor layer other than the etching prevention layer after the forming of the first-device component group, and forming a second device component group that includes components of the semiconductor device, on a face opposite to a second-semiconductor layer side of the oxide layer, with using the etching prevention layer as a reference after the removing of the first-semiconductor layer.

According to the invention, it is possible to provide a semiconductor substrate in which, during production of a semiconductor device in which a device structure is built in the front and back of the substrate, the front and back device structures can be accurately aligned with each other by a simple configuration.

BRIEF DESCRIPTION OF THE DRAWINGS

The invention disclosed herein will be understood better with reference to the following drawings of which.

DETAILED DESCRIPTION OF THE INVENTION

Hereinafter, an embodiment of the invention will be described with reference to the accompanying drawings.

First Embodiment

FIGS. 1 to 5 are views respectively showing sections in production steps of a semiconductor substrate which is an embodiment of the invention.

Figure 1:
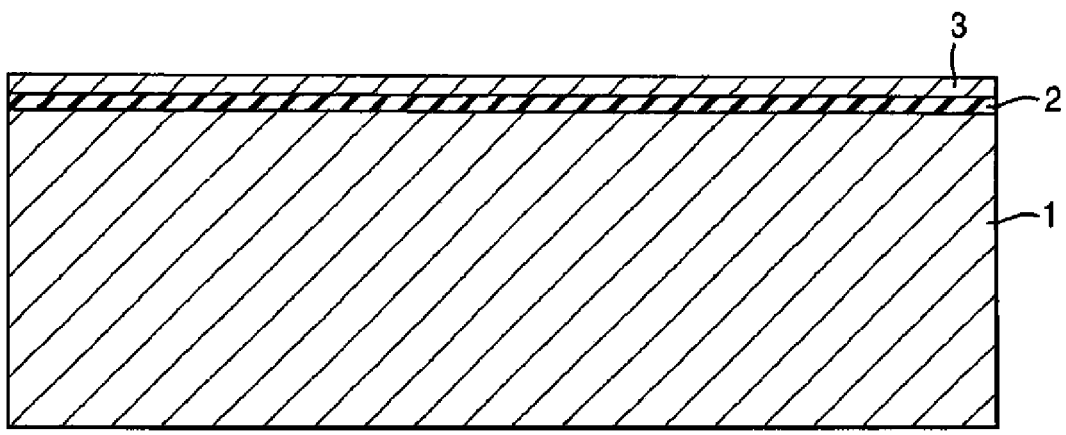
FIG. 1 is a view showing a section in a production step of a semiconductor substrate which is an embodiment of the invention.

First, an SOI (Silicon on Insulator) substrate shown in FIG. 1 is prepared. The SOI substrate may be prepared by purchasing a marketed product, or a known method such as the Smart-Cut method or the SIMOX (Separation by IMplantation of Oxygen) method. The SOI substrate shown in FIG. 1 is configured by: a silicon layer 1 which is an example of a semiconductor layer; an $SiO_2$ layer 2 which is an example of an oxide layer formed on the silicon layer 1; and a silicon layer 3 which is an example of a semiconductor layer formed on the $SiO_2$ layer 2.

Figure 2:
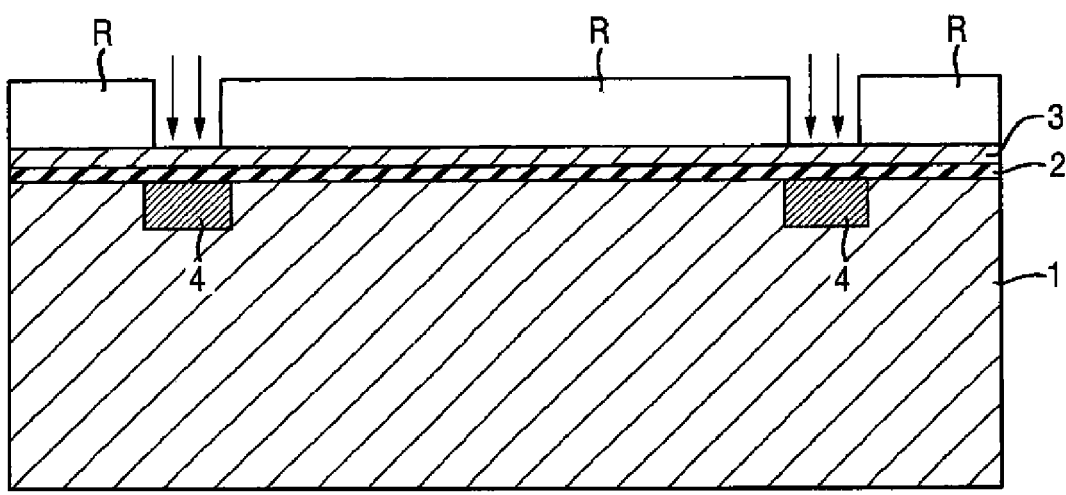
FIG. 2 is a view showing a section in a production step of the semiconductor substrate which is the embodiment of the invention.

Next, as shown in FIG. 2, a mask pattern R is formed on the silicon layer 3 by a resist material and the like. In the mask pattern, openings are disposed at positions where alignment marks for determining forming positions of devices to be built in the semiconductor substrate of the embodiment are to be formed. The openings disposed in the mask pattern R may have any shape. In the embodiment, it is assumed that the openings have a square shape of 4 μm×4 μm. When paying attention to the forming position of one device, a large number of openings are arranged at intervals of 4 μm so as to surround the forming position. However, the manner of arranging the openings is not restricted to this.

Figure 3:
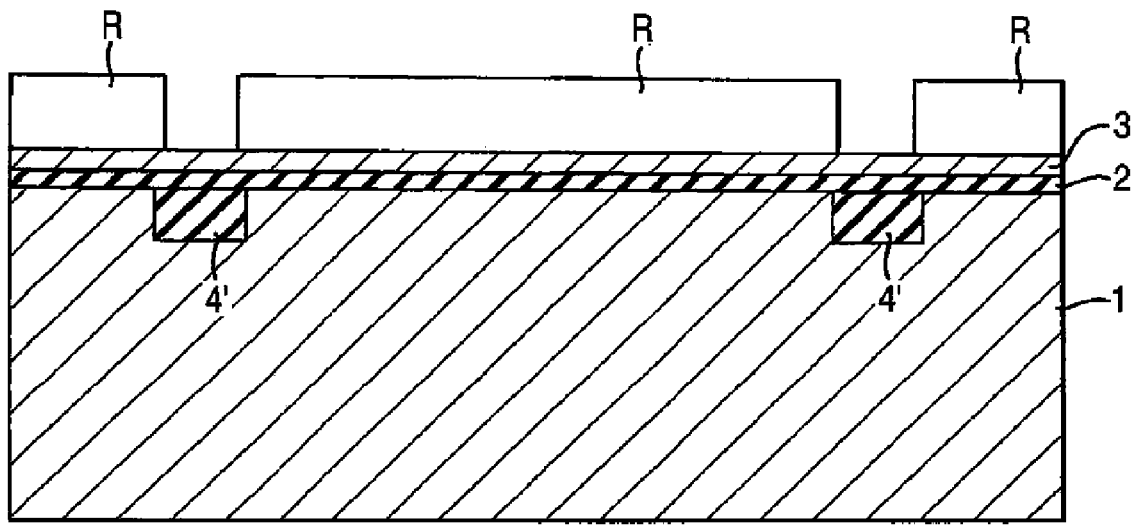
FIG. 3 is a view showing a section in a production step of the semiconductor substrate which is the embodiment of the invention.

Next, ion implantation is performed through the mask pattern R on a region which is inside from the upper face of the silicon layer 1, thereby forming regions 4 which are different in quality from the silicon layer 1. The implanted ions are oxygen ions. Next, the whole SOI substrate is heated at a high temperature of 900° C. or more, and the regions 4 are changed to an $SiO_2$ layer 4' (FIG. 3).

Figure 5:
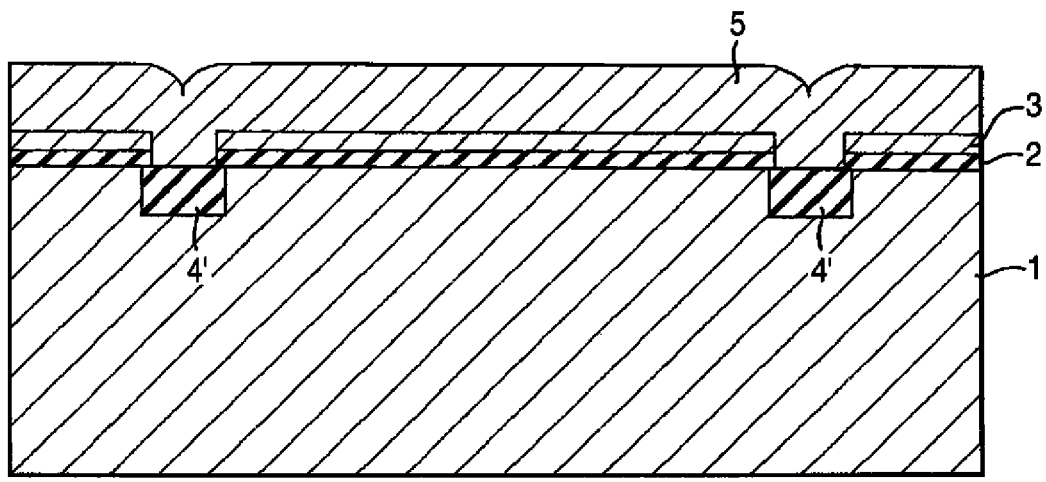
FIG. 5 is a section view of a step in production of a backside illumination image pickup device which is an example of the semiconductor device of the invention.

Next, etching is performed through the mask pattern R to remove the silicon layer 3 and $SiO_2$ layer 2 which are below the openings of the mask pattern R. Then, the mask pattern R is removed, and thereafter epitaxial growth in which the silicon layer 3 is used as a substrate is performed. As a result of the epitaxial growth, a silicon layer 5 is formed on the silicon layer 3 and the exposed faces of the silicon layer 1 (FIG. 5). The silicon layer 5 is a semiconductor crystal growth layer, and may be formed by the same or different material as the silicon layer 3. The etching which is performed through the mask pattern R causes recesses to be formed in the silicon layer 3 which functions as the substrate during the execution of the epitaxial growth, so that the recesses extend from the upper face toward the silicon layer 1. Therefore, the silicon layer 5 has a shape reflecting the shapes of the recesses, i.e., the shape in which recesses are formed above the recesses formed in the silicon layer 3.

The semiconductor substrate which has been produced in this way, and which has the configuration shown in FIG. 5 is formed as a semiconductor substrate which is suitable for production of a backside illumination image pickup device. Hereinafter, in order to describe that the semiconductor substrate is suitable for production of a backside illumination image pickup device, first, a method of producing a backside illumination image pickup device will be described.

FIGS. 6 to 9 are section views of steps in production of a backside illumination image pickup device which is an example of the semiconductor device of the invention.

Figure 6:
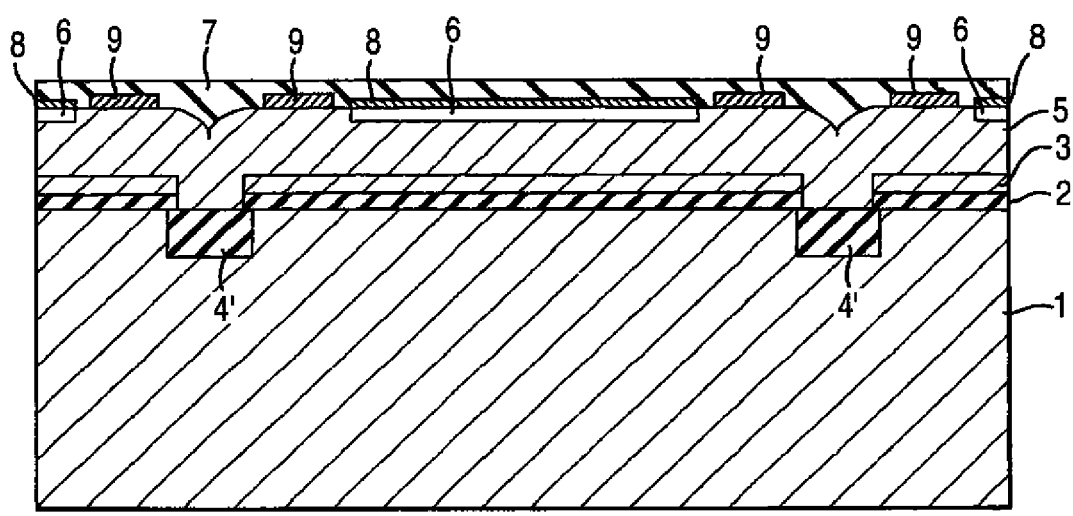
FIG. 6 is a section view of a step in production of the backside illumination image pickup device which is the example of the semiconductor device of the invention.

First, the semiconductor substrate shown in FIG. 5 is fixed while directing the silicon layer 1 to the lower side (the ground side) Since the recesses formed in the silicon layer 5 are formed at positions corresponding to those of the openings of the mask pattern R, the recesses can be used as an alignment mark. After the silicon layer 1 is set to the lower side, the recesses formed in the silicon layer 5 are detected, and, with using the recesses as a reference, a component group on the surface side of the backside illumination image pickup device is formed in a device forming region surrounded by the recesses. Specifically, as shown in FIG. 6, a first device component group is formed by known processes above and inside the upper face of the silicon layer 5 in the device forming region. The first device component group includes: a charge accumulating portion for accumulating charges which are generated in the silicon layer 5 in accordance with light incident through the lower face of the silicon layer 5; a signal outputting portion which reads the charges accumulated in the charge accumulating portion to output a signal corresponding to the charges, such as a CCD or a CMOS circuit; various wirings; pads; and the like.

In the case where the backside illumination image pickup device is configured as a CCD type one, in FIG. 6, the reference numeral 6 denotes components such as a charge accumulating portion, a CCD, and an output amplifier, the reference numeral 8 denotes those such as CCD driving electrodes, and the reference numeral 9 denotes those such as various wirings and pads. In the case where the backside illumination image pickup device is configured as a CMOS type one, the reference numeral 6 denotes components such as a charge accumulating portion and a CMOS circuit, the reference numeral 8 denotes those such as electrodes of the CMOS circuit, and the reference numeral 9 denotes those such as various wirings and pads.

Next, an insulating material is formed as a film on the silicon layer 5 in which the first device component group is built, thereby forming a planarizing layer 7. Then, as shown in FIG. 7, a supporting substrate 10 such as a glass substrate is bonded onto the planarizing layer 7 by an adhesive agent, for example, an epoxy resin.

Figure 7:
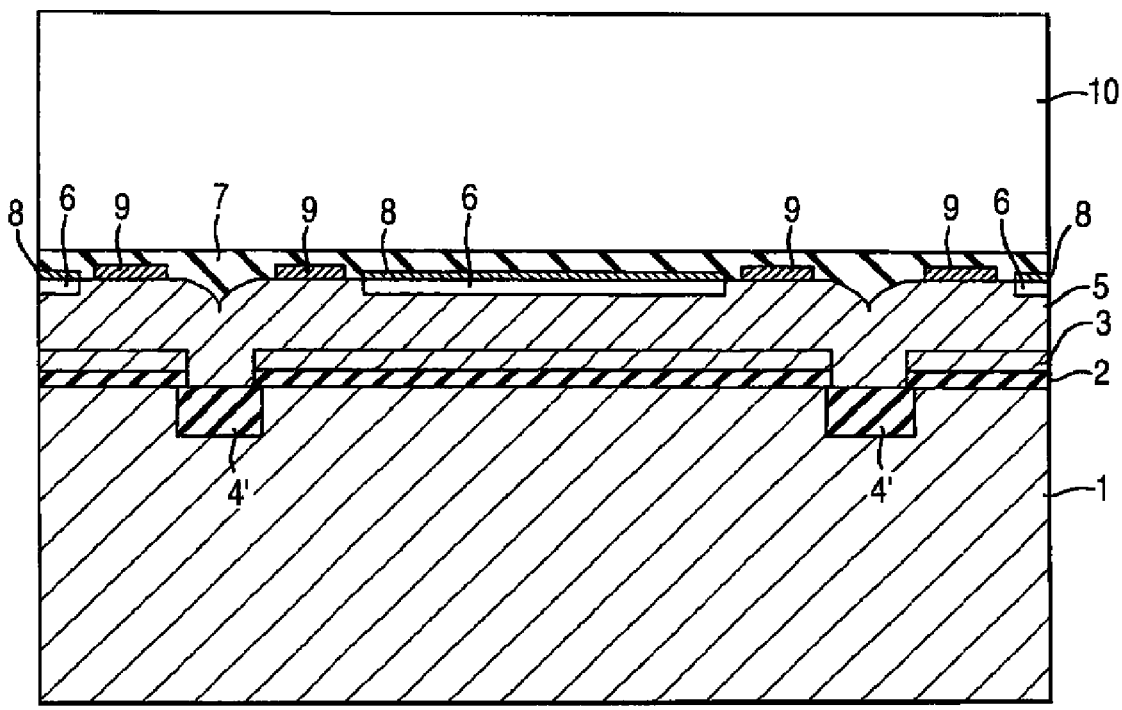
FIG. 7 is a section view of a step in production of the backside illumination image pickup device which is the example of the semiconductor device of the invention.
Figure 8:
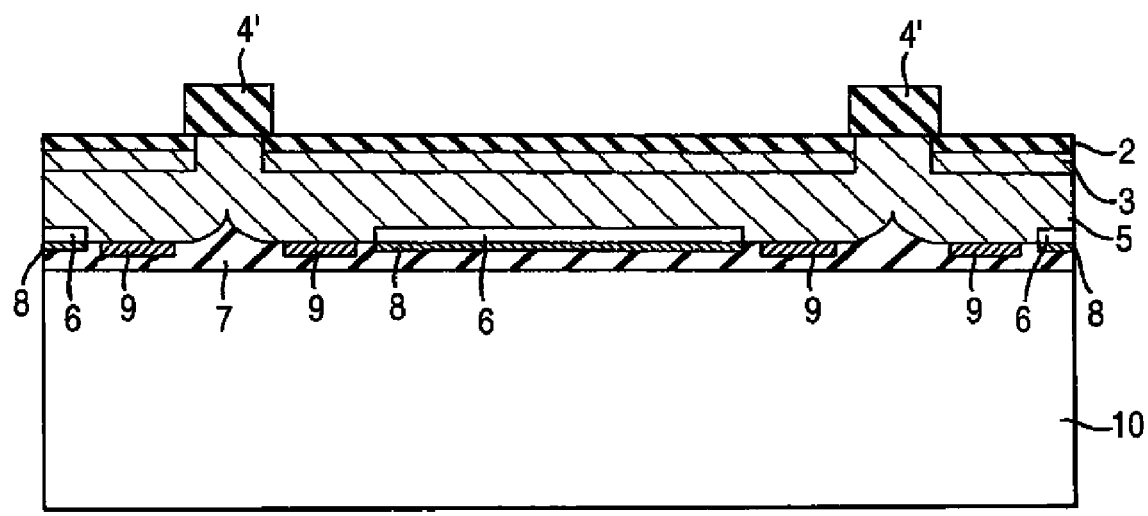
FIG. 8 is a section view of a step in production of the backside illumination image pickup device which is the example of the semiconductor device of the invention.

Next, the stacked structure is rotated from the state of FIG. 7 by 180 degrees so that the supporting substrate 10 is placed on the lower side, and then fixed. In this state, etching for removing the silicon layer 1 is performed. In this case, etching using an etchant having a high etching selectivity ratio between the silicon layer 1 and the oxide layer 4' is performed. In the etching process, the etching on the silicon layer 1 can be surely stopped by the oxide layer 4', and hence can remove the silicon layer 1 while leaving only the oxide layer 41 (FIG. 8).

The oxide layer 4' which is not removed by the etching process on the silicon layer 1 to remain is formed at a position corresponding to the recesses of the silicon layer 5. Therefore, also the oxide layer 4' can be used as an alignment mark.

Figure 9:
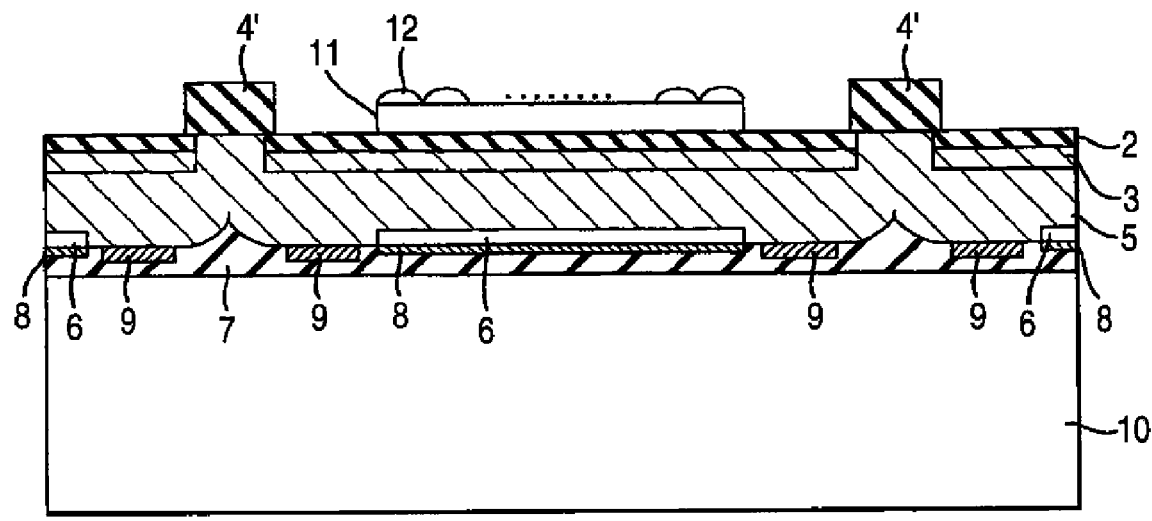
FIG. 9 is a section view of a step in production of the backside illumination image device which is the example of the semiconductor device of the invention.

After the removal of the silicon layer 1, the position of the oxide layer 4' is detected. While using the position as a reference, a second device component group including a spectral filter, microlenses, and the like which are to be formed on the back face side of the backside illumination image pickup device is formed in the device forming region surrounded by the oxide layer 4'. Specifically, as shown in FIG. 9, a spectral filter layer 11 in which spectral filters corresponding to a charge accumulating layer formed in the silicon layer 5 are arranged is formed by known processes on the $SiO_2$ layer 2 in the device forming region defined by the oxide layer 4. Microlenses 12 which constitute an optical system for collecting light to the charge accumulating layer are formed by known processes on the spectral filter layer 11. The formation of the spectral filter layer 11 or the optical system may be freely omitted in accordance with the specification of the device. Then, the device forming region is separated by a dicing step, and the separated portion is packaged, thereby completing the production of a chip of the backside illumination image pickup device.

Both the recess formed in the silicon layer 5 of the semiconductor substrate shown in FIG. 5, and the oxide layer 4' are formed at the positions corresponding to the openings of the mask pattern R. Therefore, the plan-view positions of the recess formed in the silicon layer 5 and the oxide layer 41 completely coincide with each other. Since the oxide layer 4' is configured by the material which prevents itself from being etched in the etching of the silicon layer 5, the oxide layer can surely remain also in the etching of the silicon layer 1 which is required in the production of the backside illumination image pickup device. When the semiconductor substrate shown in FIG. 5 is used, therefore, the first device component group of the backside illumination image pickup device can be formed with using the recesses formed in the silicon layer 5 as a reference, the second device component group of the backside illumination image pickup device can be formed with using the oxide layer 4' as a reference, and it is possible to produce the backside illumination image pickup device in which the positional displacement of the first and second device component groups is suppressed to the minimum degree. Therefore, the semiconductor substrate shown in FIG. 5 is a substrate which is suitable for production of a backside illumination image pickup device.

Hereinafter, advantages of the semiconductor substrate of the embodiment are listed below.

In the production of a semiconductor device, positioning can be accurately performed while requiring the trench forming step, step of embedding an oxide film in a trench, etc. which are disclosed in Patent References 1 and 2. Therefore, the production cost of the semiconductor device can be reduced.

The recesses of the silicon layer 5 and the oxide layer 4' function as an alignment mark. Therefore, the danger that the mark structure is broken by thermal stress is eliminated. The embodiment is particularly effective in a backside illumination image pickup device which must be subjected to a high-temperature thermal process.

The recesses of the silicon layer 5 which function as a reference of the forming position of the device component group on the surface side of the semiconductor device are exposed from the face where the device component group is to be formed, and hence the recesses can be easily detected. Moreover, the oxide layer 4' which functions as a reference of the forming position of the device component group on the back face side of the semiconductor device is exposed from the face where the device component group is to be formed, and hence the oxide layer 4' can be easily detected. Therefore, the accuracy of detecting an alignment mark can be enhanced as compared with the system disclosed in Patent Reference 1.

The shape of the oxide layer 4' which functions as a reference of the forming position of the device component group on the back face side of the semiconductor device can be easily adjusted by the dosage and depth of the ion implantation. Therefore, it is possible to realize a mark of a desired shape.

Figure 4:
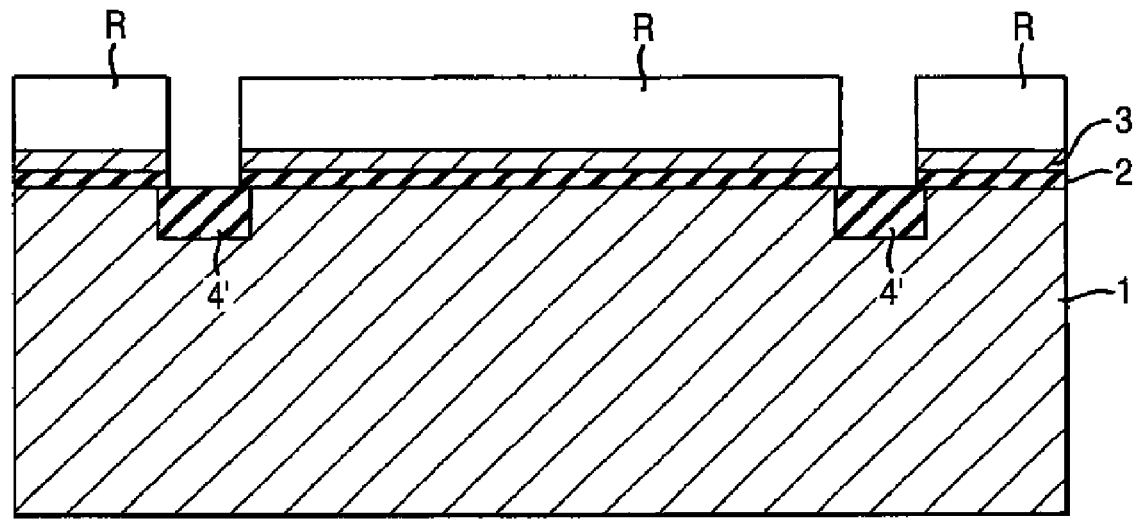
FIG. 4 is a view showing a section in a production step of the semiconductor substrate which is the embodiment of the invention.

In the above description, it is assumed that, after the oxide layer 4' is formed, all of the silicon layer 3 and SiO$_2$ layer 2 which are below the openings of the mask pattern R are removed as shown in FIG. 4. It is not required that all of these layers are removed. In order to form the recesses in the silicon layer 5, it is sufficient to remove at least a part of the silicon layer 3 which is below the openings of the mask pattern R. In this case, it is not technically easy to remove only a part of the silicon layer 3, and hence it is realistic to employ a method where etching in which the SiO$_2$ layer 2 functions as a stopper is performed to remove all of the silicon layer 3 below the openings of the mask pattern R. From the viewpoint that the accuracy of detecting recesses formed in the silicon layer 5 is enhanced (the depth of the recesses of the silicon layer 5 is increased), it is preferable to perform the etching until the silicon layer 1 is exposed as shown in FIG. 4.

In the above description, the thickness of the silicon layer 3 is small, and hence the epitaxial growth in which the silicon layer 3 is used as a substrate is performed in the state shown in FIG. 4 to form the silicon layer 5. When the thickness of the silicon layer 3 is sufficient for a backside illumination image pickup device (for example, 10 µm), the epitaxial growth step is not necessary. Also in this case, when at least a part of the silicon layer 3 below the openings of the mask pattern R is removed and recesses are formed in the silicon layer 3, the recesses can be used as an alignment mark.

In the above description, it is assumed that, after ion implantation is performed, recesses are formed in the silicon layer 3. However, this order may be reversed.

In the above description, it is assumed that the oxide layer 4' which functions as an alignment mark is formed by implanting oxygen ions. Alternatively, a semiconductor substrate may be produced by implanting boron ions in place of oxygen ions, and omitting the thermal treatment step after the ion implantation. In the case where the semiconductor substrate is used, when KOH (potassium hydroxide) is used as an etchant in the etching of the silicon layer 1 which is required in the formation of a backside illumination image pickup device, the silicon layer 1 can be removed while remaining a region into which boron ions are implanted. Therefore, the region into which boron ions are implanted can be used as an alignment mark.

Figure 10:
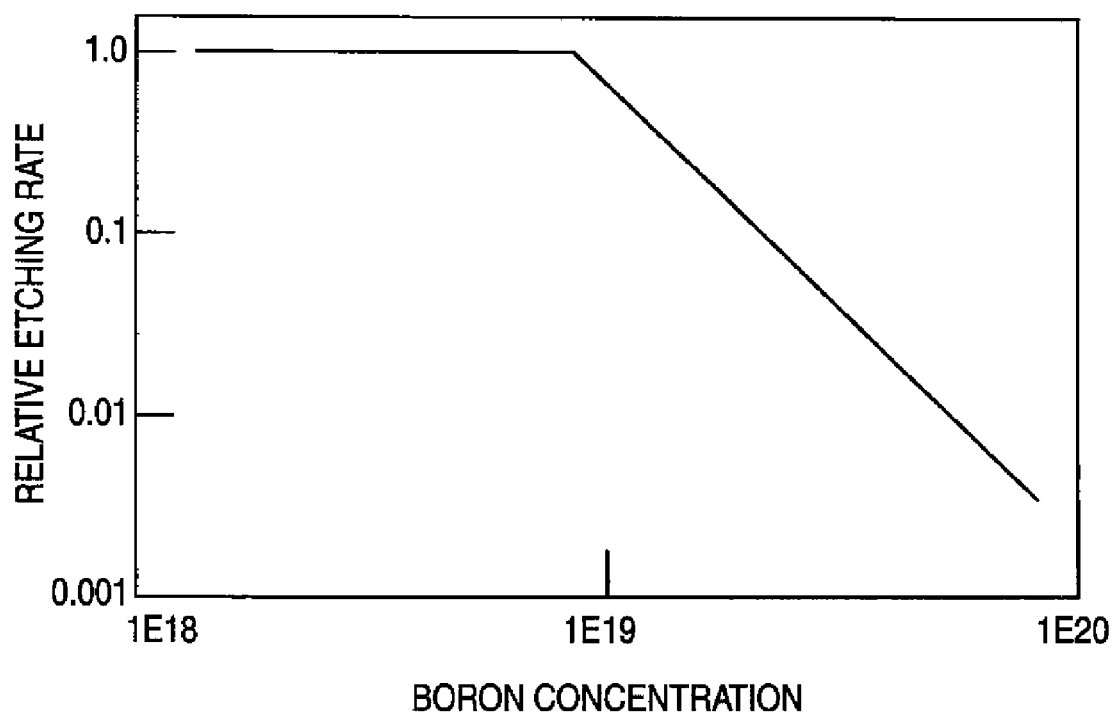
FIG. 10 is a view showing relationships between a boron concentration and a relative etching rate of boron with respect to silicon in the case where KOH (potassium hydroxide) is used as an etchant.

FIG. 10 is a view showing relationships between the boron concentration and the relative etching rate of a boron-diffused Si layer with respect to silicon in the case where KOH (potassium hydroxide) is used as an etchant. As shown in FIG. 10, it is seen that the relative etching rate rapidly begins to decrease in the vicinity of a boron concentration of $1\times10^{29}/\text{cm}^3$, and the boron-diffused Si layer becomes to be hardly etched. When boron ions are to be implanted, therefore, it is preferable to set the boron concentration to be equal to or higher than $1\times10^{19}/\text{cm}^3$, in order to allow the region into which boron is implanted to easily remain in a subsequent etching step using KOH (potassium hydroxide).

The use of the semiconductor substrate shown in FIG. 5 is effective in not limited to a backside illumination image pickup device but also a semiconductor device in which elements are required to be formed on both the face of the silicon layer 5 opposite to the side of the SiO$_2$ layer 2 and that of the SiO$_2$ layer 2 opposite to the side of the silicon layer 5, i.e., a semiconductor device in which elements are formed on the surface and the back face opposite to the surface, and the alignment of the elements on the surface with those of the hack face is required to be accurate.

Figure 11:
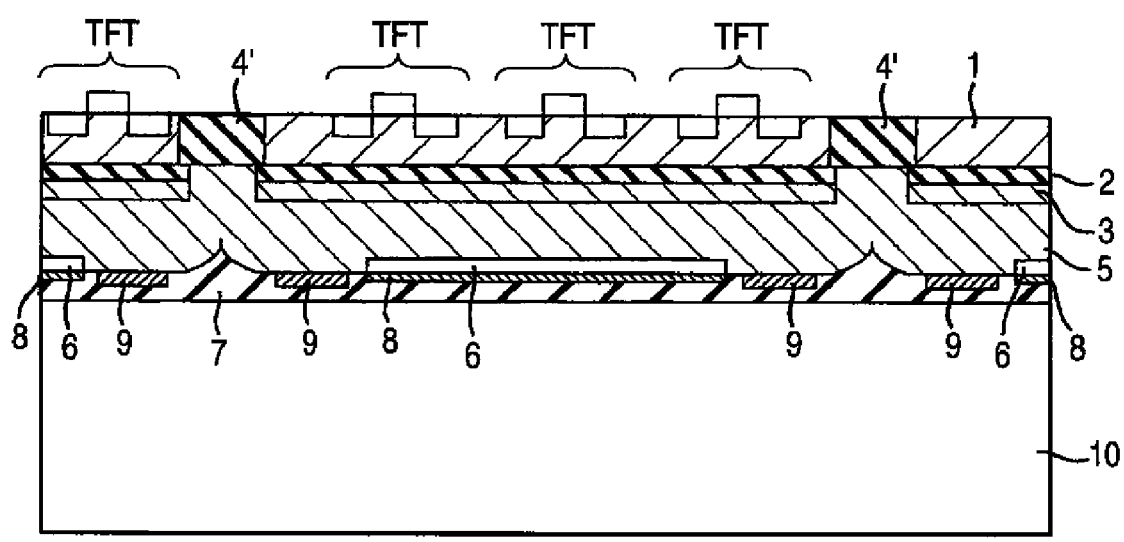
FIG. 11 is a section view showing another configuration example of the semiconductor device of the invention.

FIG. 11 is a view showing a configuration example of such a semiconductor device. In the semiconductor device shown in FIG. 11, a surface device component group is formed on the upper face of the silicon layer 5 of the semiconductor substrate shown in FIG. 5, and thereafter a silicon substrate serving as a supporting substrate is bonded thereto by the van der Waals force. Then, the silicon layer 1 is removed while directing the supporting substrate to the lower side. In this case, the etching is ended at the timing when the oxide layer 4' is exposed, and the device component group on the back face side such as TFTs are formed in and on the silicon layer 1 which is not removed and remains, whereby a semiconductor device can be produced. The silicon layer forming the device component group on the back face side may be configured by, after the silicon layer 1 is completely removed, forming low-temperature polysilicon, amorphous silicon, or a silicon crystal which is obtained by laser annealing such silicon.

As described above, the semiconductor substrate of the embodiment is effective in not limited to a backside illumination image pickup device. In the case of a backside illumination image pickup device, there is an advantage that the pixel size can be further miniaturized than that in a surface illumination image pickup device. In order to take the advantage, it is essential to improve the shape and positioning accuracies of a spectral filter and microlenses. In the case where a backside illumination image pickup device to be produced, therefore, the use of the semiconductor substrate of the embodiment is particularly effective.

The present application claims foreign priority based on Japanese Patent Application (JP 2007-124677) filed May 9 of 2007, the contents of which is incorporated herein by reference.

What is claimed is:

1. A semiconductor substrate comprising:
   a first semiconductor layer;
   an oxide layer that is formed on the first semiconductor layer;
   a second semiconductor layer that is formed on the oxide layer;
   a first recesses that are separated from each other by the second semiconductor layer and are formed in the second semiconductor layer with extending from an upper face of the second semiconductor layer toward the first semiconductor layer, the first recesses being formed at positions where an alignment mark for determining a forming position of an element which is to be built in the semiconductor substrate is to be formed; and
   etching prevention layers, each of which is inwardly formed from a position of an upper face of the first semiconductor layer, the position corresponding to each of the recesses, each of the etching prevention layers comprising a material that is prevented from being etched during etching of the first semiconductor layer.

2. A semiconductor substrate comprising:
   a first semiconductor layer;
   an oxide layer that is formed on the first semiconductor layer;
   a second semiconductor layer that is formed on the oxide layer;
   a first recess that is formed in the second semiconductor layer with extending from an upper face of the second semiconductor layer toward the first semiconductor layer, the first recess being formed at a position where an alignment mark for determining a forming position of an element which is to be built in the semiconductor substrate is to be formed; and
   an etching prevention layer that is inwardly formed from a position of an upper face of the first semiconductor layer, the position corresponding to the recess, the layer comprising a material that is prevented from being etched during etching of the first semiconductor layer,
   wherein
   the second semiconductor layer comprises:
   a third semiconductor layer that is formed on the oxide layer; and
   a fourth semiconductor layer that is formed on the third semiconductor layer,
   a second recess is formed in the third semiconductor layer with extending from an upper face of the third semiconductor layer toward the first semiconductor layer, at a position corresponding to the etching prevention layer, and
   the first recess formed in the second semiconductor layer is formed in the fourth semiconductor layer, reflecting shapes of the second recess formed in the third semiconductor layer.

3. The semiconductor substrate as claimed in claim 1, wherein
   the etching prevention layer comprises an oxide.

4. The semiconductor substrate as claimed in claim 1, wherein
   the etching prevention layer comprises a semiconductor doped with boron.

5. The semiconductor substrate as claimed in claim 4, wherein
   the boron has a concentration of $1 \times 10^{19}/cm^3$ or more.

6. A semiconductor device comprising:
   a semiconductor substrate according to claim 1;
   a first device component group that is formed on a face opposite to an oxide layer side of the second semiconductor layer being in a region of the semiconductor substrate where the element is to be formed; and
   a second device component group that is formed on a face opposite to a second-semiconductor layer side of the oxide layer being in the region of the semiconductor substrate where the element is to be formed.

7. The semiconductor device as claimed in claim 6, wherein
   the first device component group comprises:
   a charge accumulating portion that accumulates charges generated in the second semiconductor layer in accordance with light from the oxide layer side; and
   a signal outputting portion that outputs a signal corresponding to the charges accumulated in the charge accumulating portion, and
   the second device component group comprises at least one of an optical system for collecting light to the charge accumulating portion, and a spectral filter.

8. A method of producing a semiconductor device in which a semiconductor substrate according to claim 1 is used, the method comprising:
   forming a first device component group that includes components of the semiconductor device, on a face opposite to an oxide layer side of the second semiconductor layer, with using the first recess as a reference, in the second semiconductor layer and oxide layer being in a region which is defined by the first recess in the semiconductor substrate and the etching prevention layer, and in which the semiconductor device is to be formed;
   etching the first semiconductor layer to remove the first semiconductor layer other than the etching prevention layer after the forming of the first-device component group; and
   forming a second device component group that includes components of the semiconductor device, on a face opposite to a second-semiconductor layer side of the oxide layer, with using the etching prevention layer as a reference after the removing of the first-semiconductor layer.

9. A method of producing a semiconductor device in which a semiconductor substrate according to claim 4 is used, the method comprising:
   forming a first device component group that includes components of the semiconductor device, on a face opposite to an oxide layer side of the second semiconductor layer, with using the first recess as a reference, in the second semiconductor layer and oxide layer that are in a region which is defined by the first recess in the semiconductor substrate and the etching prevention layer, and in which the semiconductor device is to be formed;
   performing etching using potassium hydroxide as an etchant on the first semiconductor layer to remove the first semiconductor layer other than the etching prevention layer after the forming of the first-device component group, and
   forming a second device component group that includes components of the semiconductor device, on a face opposite to a second-semiconductor layer side of the oxide layer, with using the etching prevention layer as a reference after the removing of the first-semiconductor layer.

10. The semiconductor substrate as claimed in claim 1, wherein each of the first recesses is formed in both of the second semiconductor layer and the oxide layer with extending from an upper face of the second semiconductor layer to reach into the oxide layer toward the first semiconductor layer, and the first recesses are separated from each other by both of the second semiconductor layer and the oxide layer.

11. The semiconductor substrate as claimed in claim 2, wherein
   the etching prevention layer comprises an oxide.

12. The semiconductor substrate as claimed in claim 2, wherein
   the etching prevention layer comprises a semiconductor doped with boron.

13. The semiconductor substrate as claimed in claim 12, wherein
   the boron has a concentration of $1 \times 10^{19}/cm^3$ or more.

14. A semiconductor device comprising:
   a semiconductor substrate according to claim 2;
   a first device component group that is formed on a face opposite to an oxide layer side of the second semiconductor layer being in a region of the semiconductor substrate where the element is to be formed; and
   a second device component group that is formed on a face opposite to a second-semiconductor layer side of the oxide layer being in the region of the semiconductor substrate where the element is to be formed.

15. The semiconductor device as claimed in claim 14, wherein
   the first device component group comprises:
      a charge accumulating portion that accumulates charges generated in the second semiconductor layer in accordance with light from the oxide layer side; and
      a signal outputting portion that outputs a signal corresponding to the charges accumulated in the charge accumulating portion, and
   the second device component group comprises at least one of an optical system for collecting light to the charge accumulating portion, and a spectral filter.

16. A method of producing a semiconductor device in which a semiconductor substrate according to claim 2 is used, the method comprising:
   forming a first device component group that includes components of the semiconductor device, on a face opposite to an oxide layer side of the second semiconductor layer, with using the first recess as a reference, in the second semiconductor layer and oxide layer being in a region which is defined by the first recess in the semiconductor substrate and the etching prevention layer, and in which the semiconductor device is to be formed;
   etching the first semiconductor layer to remove the first semiconductor layer other than the etching prevention layer after the forming of the first-device component group; and
   forming a second device component group that includes components of the semiconductor device, on a face opposite to a second-semiconductor layer side of the oxide layer, with using the etching prevention layer as a reference after the removing of the first-semiconductor layer.

17. A method of producing a semiconductor device in which a semiconductor substrate according to claim 12 is used, the method comprising:
   forming a first device component group that includes components of the semiconductor device, on a face opposite to an oxide layer side of the second semiconductor layer, with using the first recess as a reference, in the second semiconductor layer and oxide layer that are in a region which is defined by the first recess in the semiconductor substrate and the etching prevention layer, and in which the semiconductor device is to be formed;
   performing etching using potassium hydroxide as an etchant on the first semiconductor layer to remove the first semiconductor layer other than the etching prevention layer after the forming of the first-device component group, and
   forming a second device component group that includes components of the semiconductor device, on a face opposite to a second-semiconductor layer side of the oxide layer, with using the etching prevention layer as a reference after the removing of the first-semiconductor layer.

* * * * *